CAM MOUNTED SERIES RESONANT TRAP FOR TUNABLE RF POWER AMPLIFIER TO ANTENNA COUPLING CIRCUIT

Filed Oct. 6, 1966

INVENTORS
DAVID L. DECKER
MORGAN F. HAMER
BY
Moody and Kintzinger
ATTORNEYS

United States Patent Office 3,435,347
Patented Mar. 25, 1969

3,435,347

CAM MOUNTED SERIES RESONANT TRAP FOR TUNABLE RF POWER AMPLIFIER TO ANTENNA COUPLING CIRCUIT

David L. Decker and Morgan F. Hamer, Cedar Rapids, Iowa, assignors to Collins Radio Company, Cedar Rapids, Iowa, a corporation of Iowa Filed Oct. 6, 1966, Ser. No. 584,906
Int. Cl. H04b *1/18;* H03j *3/22*
U.S. Cl. 325—452 7 Claims

ABSTRACT OF THE DISCLOSURE

An insulating material cam mounted series resonant trap for a tunable RF power amplifier to antenna coupling circuit with the cam resiliently deflecting a plate of a signal coupling capacitor. This is with also, a capacitor plate, of the series resonant trap circuit, in the form of a tab plate mounted on the cam brought into and out of close operationally effective proximity to the resiliently cam deflected capacitor plate.

Figure 1:
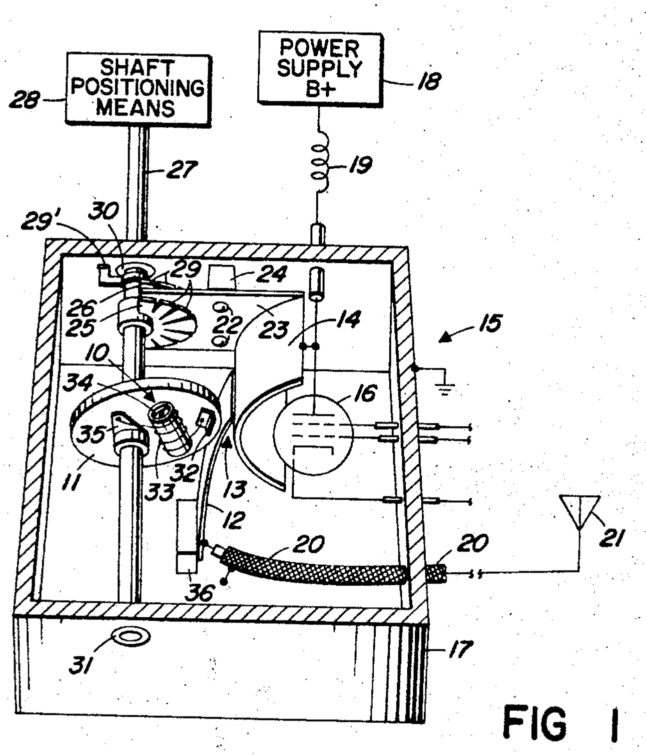

This invention relates in general to tuning devices, and in particular to tuning circuit utilizing series resonant traps that are effective through only a portion of the frequency bands of the respective tuning circuits.

Various filter arrangements have been used in radio frequency circuits for the elimination of harmonics and other spurious frequency emissions, with many of these filters, however, absorbing too much of the desired power output from useful areas of the frequency band. Some other filters perform quite well throughout most of their intended frequency bandwith range of operation. However, even with some of these some harmonic and other spurious frequency emissions within the operational filtering bandwidth of a filter are at times at such a power level within a relatively narrow bandwidth as to come through the filtering action at an excessive power level. Low pass filters have been used that pass for example, below 400 mc., and, with a power amplifier used for providing an output to an antenna, a narrow band harmonic of excessive power level has been encountered in the range of approximately 450 to 475 mc. that must be attenuated to sufficiently reduced db levels for fully acceptable operational performance.

It is, therefore, a principal object of this invention to provide a tunable RF power amplifier to antenna coupling circuit including a series resonant trap with substantially no power loss at the low end of the operational frequency bandwidth.

Another object is to provide such a tunable RF power amplifier to antenna coupling circuit with a series resonant trap effectively in the tunable circuit only through a relatively narrow portion of the operational frequency bandwidth of the circuit.

Features of this invention, useful in accomplishing the above objects include an antenna signal coupling capacitor with a flexible capacitor plate adjustably positioned by a rotatable cam of insulating material. A series resonant trap circuit, effectively in the tunable circuit only through a relatively narrow portion of the operational frequency bandwidth of the tunable RF power amplifier to antenna coupling circuit, is mounted on the cam of insulating material. This series resonant trap circuit features a trap circuit capacitor plate that is brought into and out of close proximity with the antenna coupling cam positioned flexible capacitor plate to thereby effectively bring the series resonant trap circuit into and out of the tunable circuit with rotation of the cam. It should be noted that the other plate of the antenna coupling capacitor of the circuit is coupled to the signal output plate of a power amplifier tube.

Specific embodiments representing what is presently regarded as the best mode of carrying out the invention are illustrated in accompanying drawing.

Figure 2:
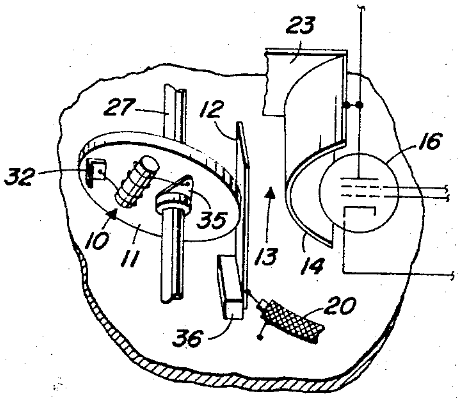

In the drawing:

FIGURE 1, represents a combination schematic circuit diagram and perspective view of the physical elements associated with a tunable RF power amplifier to antenna coupling circuit with applicant's cam mounted siries resonant trap; and, FIGURE 2, a fragmentary view of the circuit and elements of FIGURE 1 with, however, the cam and cam mounted series resonant trap rotated to a position with the series resonant trap effectively out of the circuit from the position shown in FIGURE 1.

Referring to the drawing:

A series resonant trap in the form of trap circuit 10 is mounted on a cam 11 used for positioning an antenna signal coupling circuit capacitor plate 12 in varying capacitive spacing, in the signal coupling capacitor 13, from curved capacitor plate 14. These are part of the tunable RF power amplifier to antenna coupling circuit 15 and the structure associated therewith as shown in FIGURE 1. A power amplifier final power output tube 16, diagrammatically indicated as being of standard cathode, control grid, screen and output plate four-element construction, is contained within module box 17. The plate of power amplifier tube 16 is positively biased by, for example, B+ voltage from voltage supply 18 through RF blocking coil 19 in a conventional manner, and is provided with a power output connection to capacitor plate 14. The adjustably positionable capacitor plate 12 is connected to the center conductor of coaxial line 20 and througgh this line in a signal output connection to antenna 21.

The curved capacitor plate 14 connected to the power output plate of tube 16 is mounted within module box 17 with screws 22, extended through a tuning capacitor extension 23 of the plate 14, into a mounting block of insulating material 24 mounted on a wall of the module box 17 in a conventional manner, detail not shown. The module box 17 itself is formed of conductive material serving multi-function uses including use as a container, component mount, RF shielding for portions of the RF circuitry, and use as a common voltage potential reference source (ground). The tunable capacitor extension 23 of capacitor plate 14 extends into variable capacitive relation with tunable capacitor plates 25 and 26 that are fixed on rotatable shaft 27 for tuning adjustment rotation therewith as determined by the shaft positioning means 28. Tuning capacitor plates 25 and 26 are equipped with multiple bendable tracking adjustment tabs 29 in accord with conventional construction of such tracking adjusted tuning capacitors. The cam 11, of non-conductive insulating material, is also fixed on shaft 27 for simultaneous rotation with frequency tuning rotation of capacitor plates 25 and 26. It should be noted that the capacitor plates 25 and 26 are grounded through shaft 27 and a sliding contact extension 29′ from shaft 27 to the module box case 17. A more reliable potential reference ground is provided by such means than through reliance on ground contact through the shaft bearings 30 and 31 used for rotatably mounting shaft 27.

The series resonant trap circuit 10 mounted on cam 11 is shown to include a trap circuit capacitor plate 32 in the form of a tab mounted adjacent the periphery of cam 11 in a predetermined angular location thereon. The capacitor plate 32 is shown to be connected to a coil 33, including a center adjusting slug 34, and through the coil 33 to a conductive tab connection 35 to shaft 27 and thereby potential reference ground. Tuning adjustment of the series resonant trap circuit 10 may be accomplished by adjusting the position of the slug 34 within coil 33, varying the size of the plate 32, and/or positioning of the plate 32 or by bending the plate 32 to give various frequency range settings and to govern the intensity of effect as a series resonant trap circuit 10 in conjunction with the power amplifier to antenna capacitive coupling circuit 15.

In the embodiment shown the tab capacitor plate 32 of the series resonant trap circuit is positioned on a high portion of the cam 11 to come into effect when the signal coupling capacitor plate 12 is moved by the cam into relatively closely spaced higher capacitive relation to capacitor plate 14 at the low frequency end of the adjustable tuned operational range thereof. When the cam 11 is rotated to decrease the capacitance of this capacitive coupling by permitting an increase in spacing between capacitor plate 12 and the curved capacitor plate 14 and thereby tune the coupling circuit, with simultaneous tuning of capacitor plates 23, 25 and 26, to a higher tuned frequency within the operational bandwidth of the tunable coupling, the capacitor plate 32 is very quickly moved out of effective series resonant trap signal capacitive pickup relationship with the capacitor plate 12 to positions as far away from capacitor plate 12 as that illustrated in FIGURE 2.

In an operational embodiment of a tunable RF power amplifier to antenna coupling circuit 15, the tuning range employed was approximately from 200 mc. to 400 mc. with a spurious signal problem encountered when the coupling circuit was tuned to approximately 225 mc. The spurious signal being generated was a harmonic that was not filtered enough to a desirable depressed db level although filtered to some extent by a low pass filter designed to pass signal frequencies primarily below approximately 400 mc. Applicant's series resonant trap circuit is arranged to come into effect at harmonic spurious signaling approximately through the range of 450 to 475 mc. when the signal coupling circuit is tuned to approximately 225 mc. It should be noted that more than one such series resonant trap circuit may be employed on a cam 11 with a signal capacitive coupling circuit to effectively depress such spurious signals to acceptably reduced db levels. Spurious signals trapped may be at various specifically narrowly defined areas both within and without the normal operational bandwidth of the tunable signal coupling circuit for any such spurious frequencies that may be particularly troublesome.

Signal coupling circuit capacitor plate 12 is mounted on an insulating block 36 in a conventional manner, detail not shown, with the insulating block 36 in turn mounted on the bottom of module box 17 in a conventional manner, detail not shown, such that the capacitor plate 12 is supported in electrically insulated relation from the box 17. Further, the signal coupling capacitor plate 12 is in effect a resilient cantilever spring so mounted on the insulating block and so positioned as to be in resiliently biased riding engagement with the peripheral camming surface of cam 11 through much, if not all, of the tuning rotative movement of the cam 11 with tuning rotative movement of shaft 27.

Whereas, this invention is here illustrated and described with respect to a specific embodiment thereof, it should be realized that various changes may be made without departing from the essential contributions to the art made by the teachings hereof.

We claim:

1. In a tunable RF signal coupling circuit including a variable value signal coupling capacitor with at least two plates and having a capacitor plate space varying means, a series resonant frequency trap circuit including a trap circuit capacitor plate that is mounted on said signal coupling capacitor plate space varying means for movement into and out of effective trap circuit resonant frequency operation with movement of said signal coupling capacitor plate space varying means.

2. The tunable RF signal coupling circuit of claim 1, wherein the signal coupling capacitor includes a capacitor plate constructed and mounted for movement relative to the other plate of said signal coupling capacitor, and with said capacitor plate space varying means including a cam movable for positioning the movable capacitor plate relative to the other capacitor plate of said signal coupling capacitor.

3. The tunable RF signal coupling circuit of claim 2, wherein said cam means is a cam of insulating material mounted for cam driving movement in positioning the movable plate of said capacitor; and drive means for positioning said cam means.

4. The tunable RF signal coupling circuit of claim 3, wherein said series resonant frequency trap circuit also includes a coil, and series resonant tuning means mounted on said cam of insulating material

5. The tunable RF signal coupling circuit of claim 4, wherein said cam of insulating material is fixed for tuning rotation on a rotatably mounted shaft of electrically conductive material; circuit connection of said series resonant frequency trap circuit to said rotatable shaft; and means connecting said shaft to a voltage potential reference source.

6. The tunable RF signal coupling circuit of claim 5 signal coupling an RF power amplifier to an antenna, and including additional capacitive tuning means with capacitive plate means mounted on said shaft for tuning movement with rotation of the shaft.

7. The tunable RF signal coupling circuit of claim 2, wherein said cam is mounted on a driving shaft for driving engagement with the movable plate of said signal coupling capacitor; and said movable plate of said signal coupling capacitor is in the form of a resiliently deflectable cantilever type beam mounted for resiliently deflectable engagement against the camming surface of said cam through at least a portion of the movement of said cam.

References Cited

UNITED STATES PATENTS

| | | | |
|---|---|---|---|
| 2,510,272 | 6/1950 | Arnett | 334—82 XR |
| 3,183,912 | 5/1965 | Mogilner | 317—249 XR |
| 2,216,540 | 10/1940 | Mountjoy | 325—379 XR |

KATHLEEN H. CLAFFY, *Primary Examiner.*

BARRY PAUL SMITH, *Assistant Examiner.*

U.S. Cl. X.R.

334—82, 80